(12) United States Patent
Chen et al.

(10) Patent No.: US 8,764,457 B2
(45) Date of Patent: Jul. 1, 2014

(54) CIRCUIT BOARD DEVICE AND A COMBINED CIRCUIT BOARD AND ELECTRONIC CARD ASSEMBLY

(75) Inventors: Chih-Ping Chen, New Taipei (TW); Ping-Yu Ko, New Taipei (TW)

(73) Assignee: Wistron Corporation, New Taipei (TW)

( * ) Notice: Subject to any disclaimer, the term of this patent is extended or adjusted under 35 U.S.C. 154(b) by 39 days.

(21) Appl. No.: 13/585,070

(22) Filed: Aug. 14, 2012

(65) Prior Publication Data

US 2013/0072038 A1    Mar. 21, 2013

(30) Foreign Application Priority Data

Sep. 15, 2011  (TW) .............................. 100133184 A

(51) Int. Cl.
*H01R 12/00*    (2006.01)
*H05K 7/02*    (2006.01)

(52) U.S. Cl.
USPC ................................ 439/65; 439/74; 361/810

(58) Field of Classification Search
USPC ............. 439/65, 74, 326–331, 308, 351, 352, 439/630, 836, 59–62, 533, 534, 298, 299, 439/557, 567; 361/807, 810, 756, 727, 737, 361/759, 740, 760, 736, 720, 748, 801–803
See application file for complete search history.

(56) References Cited

U.S. PATENT DOCUMENTS

| | | | | |
|---|---|---|---|---|
| 5,452,184 | A  * | 9/1995 | Scholder et al. ............... | 361/799 |
| 7,074,090 | B2 | 7/2006 | Ho et al. | |
| 7,300,298 | B2 * | 11/2007 | Kameda ........................ | 439/326 |
| 7,467,963 | B2 * | 12/2008 | Chen .............................. | 439/328 |
| 8,517,744 | B2 * | 8/2013 | Lin ................................. | 439/62 |
| 2007/0099470 | A1* | 5/2007 | Yang et al. ..................... | 439/326 |
| 2010/0165592 | A1* | 7/2010 | Takao ............................ | 361/807 |

FOREIGN PATENT DOCUMENTS

| | | |
|---|---|---|
| TW | 200638842 A | 11/2006 |
| TW | 200937756 A | 9/2009 |

OTHER PUBLICATIONS

Taiwanese Office Action with English translation of relevant portions of TW 100133184 dated Sep. 12, 2013.

* cited by examiner

*Primary Examiner* — Renee S Luebke
*Assistant Examiner* — Harshad Patel
(74) *Attorney, Agent, or Firm* — Nixon & Vanderhye, P.C.

(57) ABSTRACT

A circuit board device for fixing an electronic card, which is formed with at least one aperture, includes a circuit board and a securing member. The circuit board includes a board body formed with two through holes, and a socket connector provided on the board body for mating with the electronic card. The securing member includes a pressing plate for pressing against the electronic card, at least one engaging stud projecting from a bottom end of the pressing plate for engaging the aperture, and two resilient engaging arms provided respectively on left and right sides of the pressing plate. The engaging arms extend respectively through the through holes and engage releasably the board body.

14 Claims, 12 Drawing Sheets

CIRCUIT BOARD DEVICE AND A COMBINED CIRCUIT BOARD AND ELECTRONIC CARD ASSEMBLY

CROSS REFERENCE TO RELATED APPLICATION

This application claims priority of Taiwanese Patent Application No. 100133184, filed on Sep. 15, 2011, the disclosure of which is incorporated herein by reference.

BACKGROUND OF THE INVENTION

1. Field of the Invention

The present invention relates to a circuit board device, and more particularly to a circuit board device for fixing an electronic card and a combined circuit board and electronic card assembly.

2. Description of the Related Art

Currently, the functional requirements of an electronic device (e.g., a notebook computer or a tablet computer) are gradually increasing. A plurality of electronic components are layout on a surface of a circuit board, and thus the space that can be utilized on the surface of the circuit board is limited. A socket connector is also disposed on the surface of the circuit board for mating with an electronic card. After a user inserts the electronic card into the socket connector, screws are passed through through holes in the electronic card and are screwed respectively to studs on the circuit board's surface, thus locking the electronic card on the circuit board.

In the above-mentioned screw locking method, the user needs an assistant tool (e.g., a screwdriver) to perform the screw locking operation. Therefore, assembling of the electronic card on the circuit board is inconvenient and causes a waste of time. Furthermore, since the studs are fixed on the circuit board's surface, when the user intends to insert another electronic card with a greater length into the socket connector, the electronic card is blocked by the studs and thus cannot be inserted into the socket connector. Consequently, electronic cards of different lengths cannot be selectively inserted into the socket connector for use, so that the space on the surface of the circuit board cannot be fully utilized.

SUMMARY OF THE INVENTION

Therefore, an object of the present invention is to provide a circuit board device having a circuit board, and a securing member connected detachably to the circuit board. Through the detachable configuration of the securing member, the circuit board can accommodate electronic cards of different lengths. Further, the securing member can easily and quickly fix the electronic cards of different lengths on the circuit board.

The object of the present invention and the solution to the problem existing in the prior art can be realized by using the below technical means. According to one aspect of disclosure of the present invention, a circuit board device for fixing an electronic card comprises a circuit board and a securing member. The electronic card is formed with at least one aperture. The circuit board includes a board body, and a socket connector provided on the board body for mating with the electronic card. The board body is formed with two first through holes spaced apart from each other in a left-right direction. The securing member includes a pressing plate for pressing against the electronic card, at least one engaging stud projecting from a bottom end of the pressing plate for engaging the aperture, and two resilient engaging arms provided respectively on left and right sides of the pressing plate. The resilient engaging arms extend respectively through the first through holes and engage releasably the board body.

The object of the present invention and the solution to the problem existing in the prior art can be realized by using the below technical means.

The board body includes a top surface and a bottom surface. Each of the first through holes penetrates the top and bottom surfaces. Each of the resilient engaging arms includes a hook abutting against the bottom surface, and a stopping bump disposed above the hook and abutting against the top surface.

Each of the resilient engaging arms further includes a bent arm section extending outwardly and arcuately from a respective one of the left and right sides of the pressing plate, and a non-bent arm section extending downwardly from the bent arm section. The hook is formed at a bottom end of the non-bent arm section.

Each of the first through holes has a top edge. The hook of each resilient engaging arm has a downward slope surface abutting against the top edge before each of the resilient engaging arms extends through the respective first through hole.

The top surface of the board body is formed with at least one first positioning hole. The securing member includes a blocking plate extending from a bottom side of the pressing plate, and at least one positioning boss projecting from a bottom end of the blocking plate. The blocking plate is adapted to abut against one end of the electronic card that is opposite to the socket connector. The positioning boss is engaged to the first positioning hole.

The top surface of the board body is formed with two first positioning holes spaced apart from each other in the left-right direction. The securing member includes two positioning bosses projecting from the bottom end of the blocking plate and respectively engaged to the first positioning holes.

The electronic card is formed with two apertures spaced apart from each other in the left-right direction. The securing member includes two engaging studs projecting from the bottom end of the pressing plate for engaging respectively the two apertures.

Another object of the present invention is to provide a combined circuit board and electronic card assembly. Through the detachable configuration of the securing member, the circuit board can accommodate electronic cards of different lengths. Further, the securing member can easily and quickly fix the electronic cards of different lengths on the circuit board.

According to another aspect of disclosure of the present invention, a combined circuit board and electronic card assembly comprises a circuit board, a securing member, and a first electronic card. The circuit board includes a board body, and a socket connector provided on the board body. The board body is formed with two first through holes spaced apart from each other in the left-right direction, and two second through holes spaced apart from each other in the left-right direction. Each of the first through holes is disposed between the socket connector and the second through holes. The securing member includes a pressing plate, at least one engaging stud projecting from a bottom end of the pressing plate, and two resilient engaging arms provided respectively on left and right sides of the pressing plate. The first electronic card has a first length, and is formed with at least one first aperture. When the first electronic card is inserted into the socket connector and the pressing plate is pressed against the first electronic card, the engaging stud engages the first aperture, and the resilient engaging arms extend respectively through the first through holes and engage releasably the board body.

The combined circuit board and electronic card assembly further comprises a second electronic card. The second electronic card has a second length greater than the first length, and is formed with at least one second aperture. The first electronic card and the second electronic card are selectively inserted into the socket connector. When the second electronic card is inserted into the socket connector and the pressing plate is pressed against the second electronic card, the engaging stud engages the second aperture, and the resilient engaging arms extend respectively through the second through holes and engage releasably the board body.

Through the aforesaid technical means, the advantages and effects of the combined circuit board and electronic card assembly of the present invention reside in that, through the detachable configuration of the securing member, the circuit board can accommodate the first electronic card and the second electronic card of different lengths. Moreover, because the securing member can easily and quickly fix or permit removal of the first and second electronic cards of different lengths on or from the circuit board, the time of assembling or disassembling the combined circuit board and electronic card assembly can be effectively reduced.

BRIEF DESCRIPTION OF THE DRAWINGS

Other features and advantages of the present invention will become apparent in the following detailed description of the embodiment with reference to the accompanying drawings, of which.

DETAILED DESCRIPTION OF THE PREFERRED EMBODIMENT

The above-mentioned and other technical contents, features, and effects of this invention will be clearly presented from the following detailed description of one embodiment in coordination with the reference drawings. Through description of the concrete implementation method, the technical means employed and the effectiveness to achieve the predetermined purposes of the present invention will be thoroughly and concretely understood. However, the enclosed drawings are used for reference and description only, and are not used for limiting the present invention.

Figure 1:
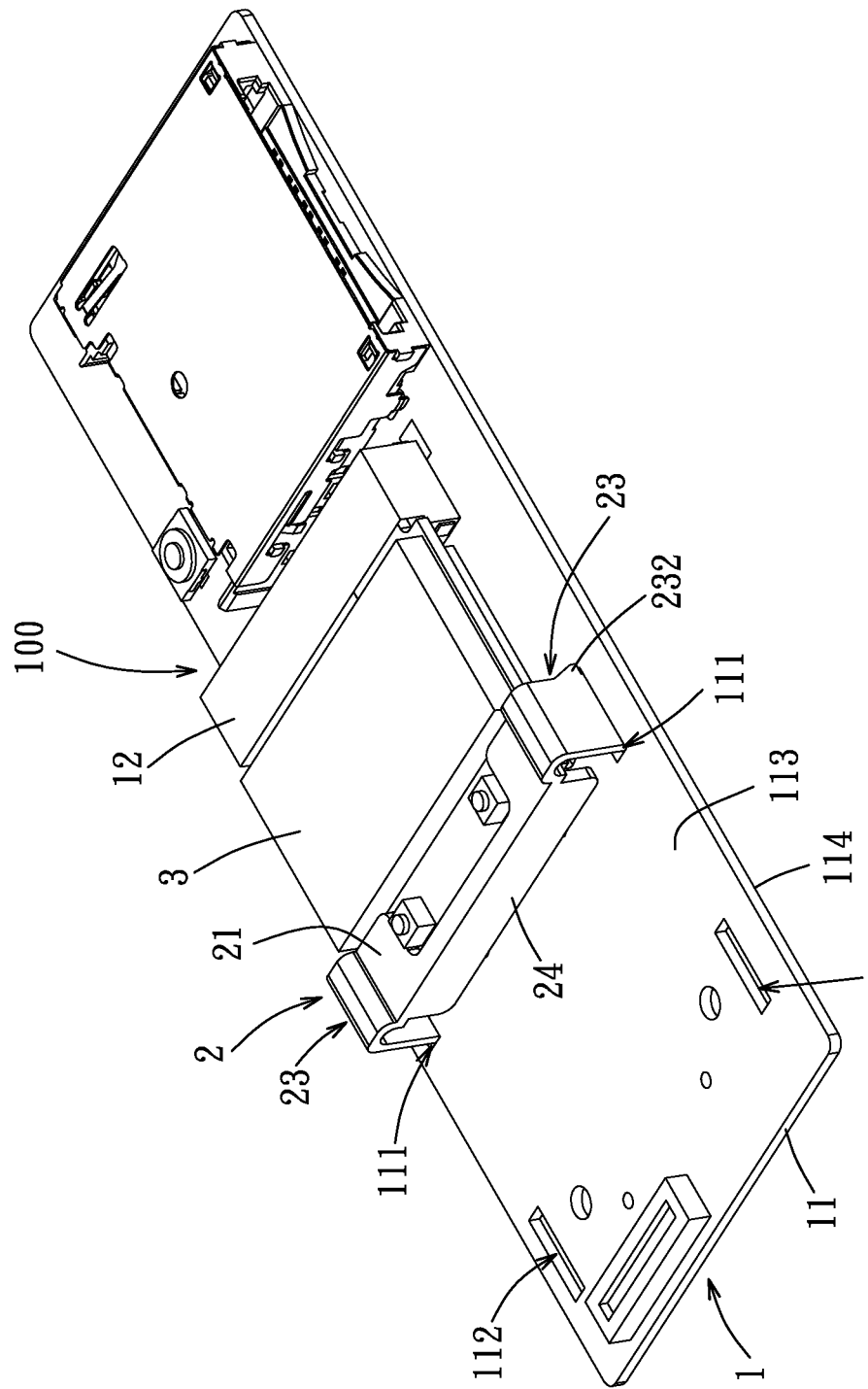
FIG. 1 is a perspective view of a combined circuit board and electronic card assembly according to an embodiment of the present invention, illustrating a first electronic card being fixed on a circuit board of the assembly.
Figure 2:
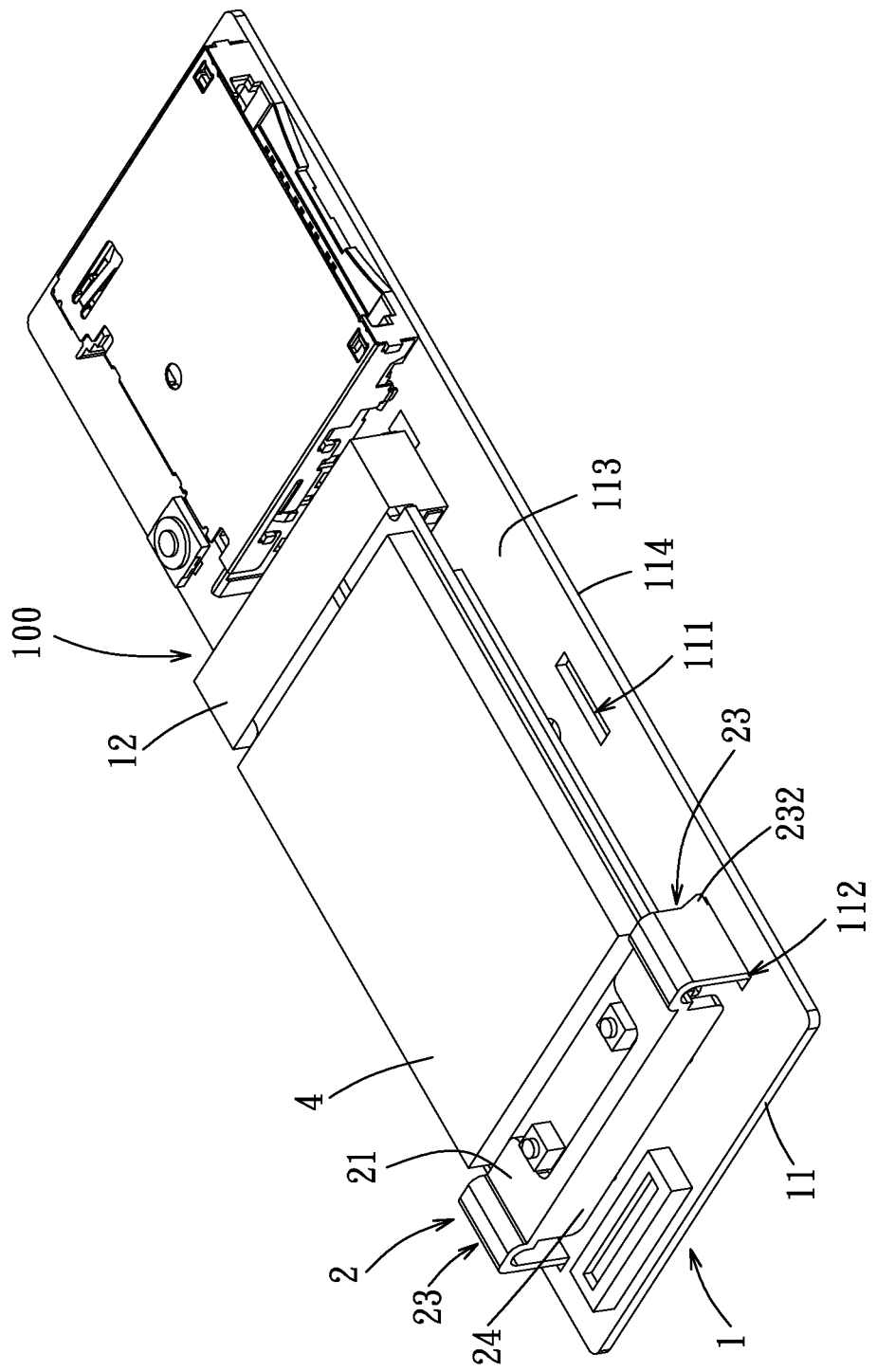
FIG. 2 is a view similar to FIG. 1, but illustrating a second electronic card being fixed on the circuit board of the assembly.

FIGS. 1 and 2 illustrate a combined circuit board and electronic card assembly according to an embodiment of the present invention. The assembly comprises a circuit board 1, a securing member 2, a first electronic card 3, and a second electronic card 4. The circuit board 1 and the securing member 2 constitute a circuit board device 100 which is applied to an electronic device, such as a notebook computer or a tablet computer. In this embodiment, the first electronic card 3 is exemplified as a WLAN (Wireless Local Area Network) card, and the second electronic card 4 is exemplified as a 3G network card. Alternatively, the first electronic card 3 and the second electronic card 4 may also be electronic cards of other specifications, and are not limited to the disclosure of this embodiment.

Figure 3:
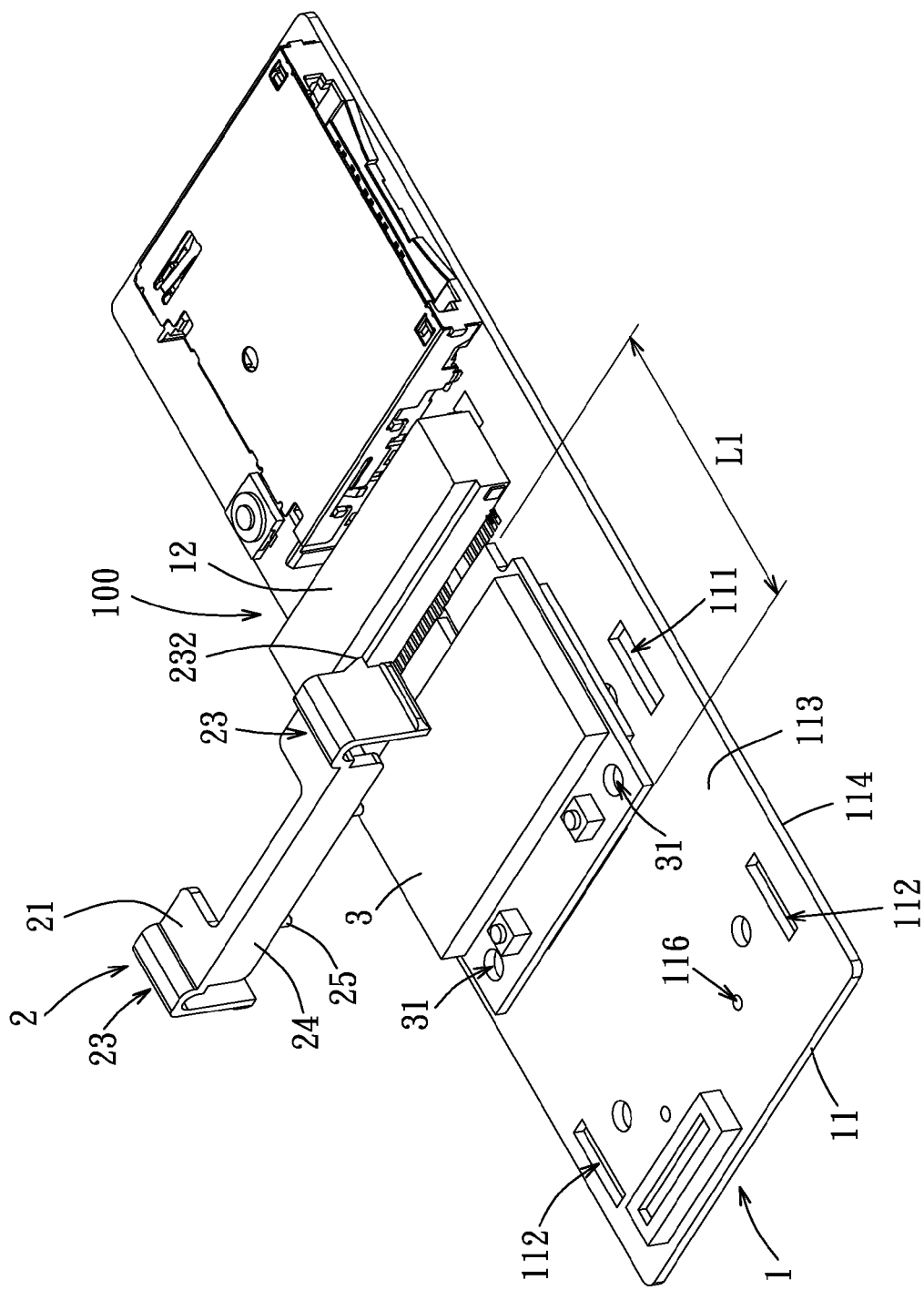
FIG. 3 is an exploded perspective view of the combined circuit board and electronic card assembly of FIG. 1.
Figure 4:
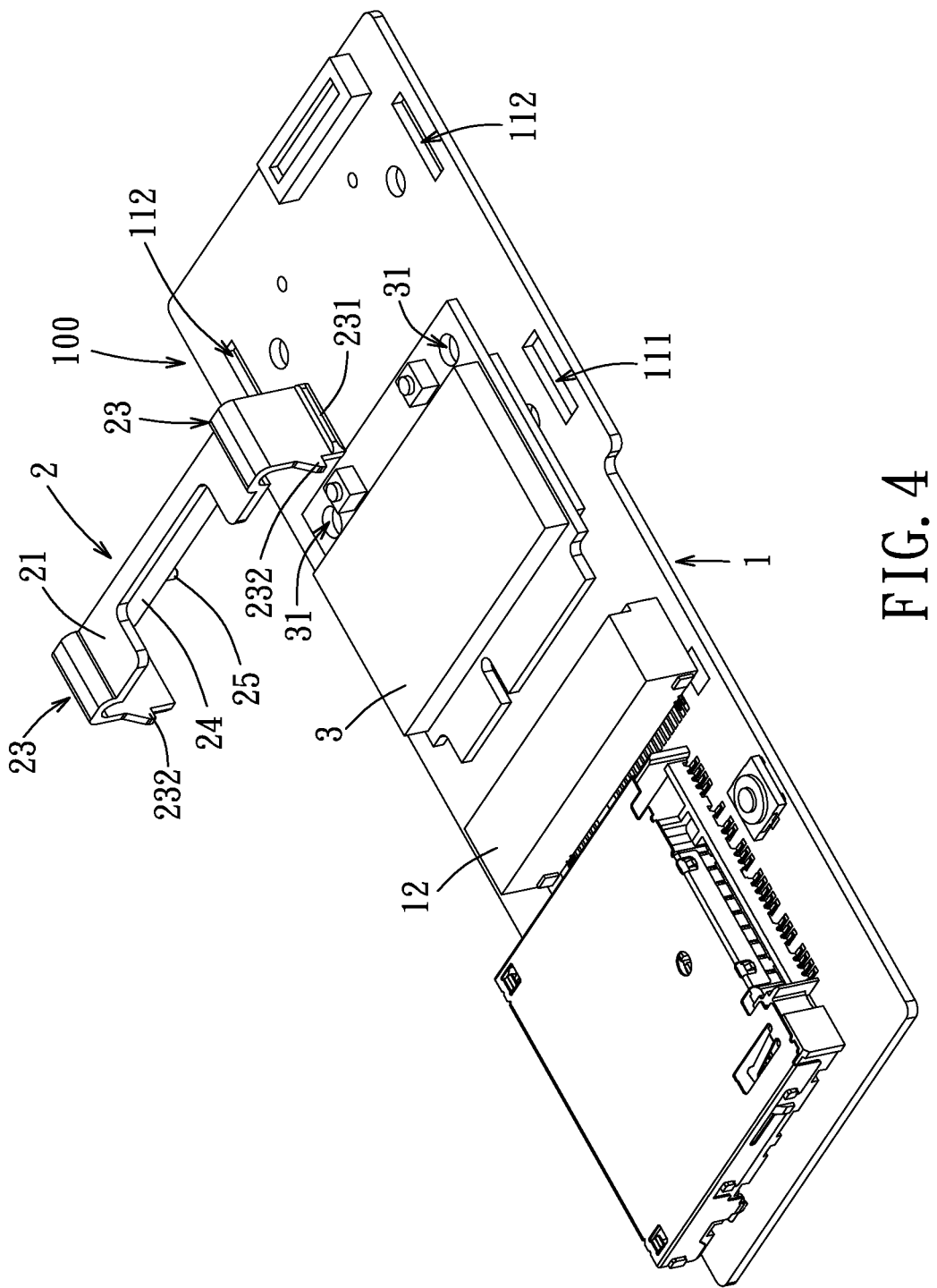
FIG. 4 is an exploded perspective view of the combined circuit board and electronic card assembly of FIG. 1 taken from another angle.
Figure 5:
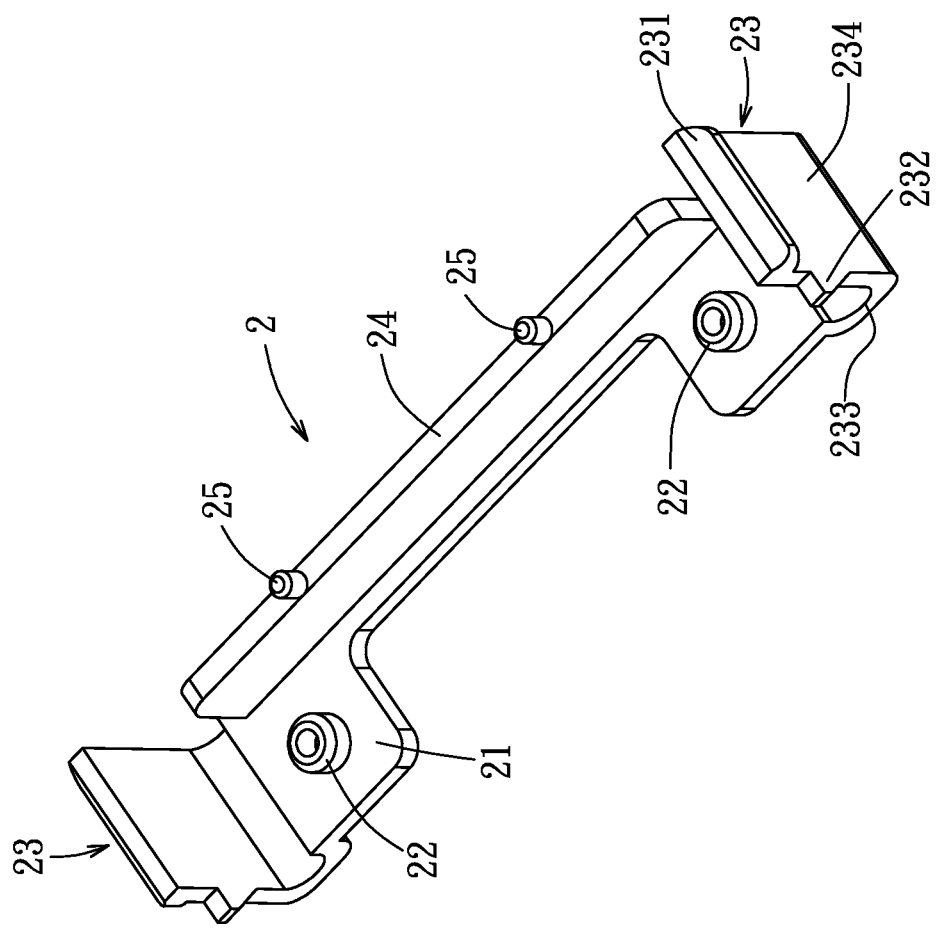
FIG. 5 is a bottom perspective view of a securing member of the embodiment of the present invention.

As shown in FIGS. 3, 4 and 5, the circuit board 1 includes a board body 11 and a socket connector 12 provided on the board body 11. The board body 11 is formed with two first through holes 111 spaced apart from each other in a left-right direction. The securing member 2 includes a pressing plate 21, at least one engaging stud 22 projecting from a bottom end of the pressing plate 21, and two resilient engaging arms 23 provided respectively on left and right sides of the pressing plate 21. The first electronic card 3 and the second electronic card 4 can be selectively inserted into the socket connector 12 of the circuit board 1. The first electronic card 3 has a first length (L1) extending in a front-rear direction, and is formed with at least one first aperture 31 proximate to a rear end thereof that is distal from the socket connector 12. When the first electronic card 3 is inserted into the socket connector 12 and the pressing plate 21 is pressed against the first electronic card 3, the engaging stud 22 engages the first aperture 31, and the resilient engaging arms 23 extend through the respective first through holes 111 and engage releasably the board body 11. Hence, the first electronic card 3 is fixed on the board body 11 of the circuit board 1 by the securing member 2, and removal of the first electronic card 3 from the socket connector 12 is prevented.

Furthermore, the board body 11 of the circuit board 1 is further formed with two second through holes 112 spaced apart from each other in the left-right direction. Each of the first through holes 111 is disposed between the socket connector 12 and a corresponding one of the second through holes 112. The second electronic card 4 has a second length (L2) (see FIG. 12) extending in the front-rear direction and greater than the first length (L1). Thus, the first electronic card 3 and the second electronic card 4 of this embodiment are two electronic cards of different lengths. The second electronic card 4 is formed with at least one second aperture 41 (see FIG.

12) proximate to a rear end thereof that is distal from the socket connector 12. When the second electronic card 4 is inserted into the socket connector 12 and the pressing plate 21 is pressed against the second electronic card 4, the engaging stud 22 engages the second aperture 41, and the resilient engaging arms 23 extend through the respective second through holes 112 and engage releasably the board body 11. Hence, the second electronic card 4 is fixed on the board body 11 of the circuit board 1 by the securing member 2, and removal of the second electronic card 4 from the socket connector 12 is prevented.

It should be noted that, in this embodiment, the first electronic card 3 is formed with two first apertures 31 spaced apart from each other in the left-right direction, and the second electronic card 4 is also formed with two second apertures 41 spaced apart from each other in the left-right direction. Further, the securing member 2 includes two engaging studs 22 projecting from the bottom end of the pressing plate 21. The two engaging studs 22 are selectively engageable with the respective first apertures 31 and the respective second apertures 41 to prevent movement of the first electronic card 3 or the second electronic card 4 in the front-rear and left-right directions.

In this embodiment, the board body 11 of the circuit board 1 includes a top surface 113 and a bottom surface 114 opposite to the top surface 113. Each of the first and second through holes 111, 112 is rectangular and extends in the front-rear direction. Each of the first and second through holes 111 penetrates the top and bottom surfaces 113, 114 of the board body 11. Each of the resilient engaging arms 23 of the securing member 2 includes a hook 231, and a stopping bump 232 disposed above the hook 231. The hooks 231 of the engaging arms 23 abut against the bottom surface 114 of the board body 11 and the stopping bumps 232 of the engaging arms 23 abut against the top surface 113 of the board body 11 when the engaging arms 23 extend through the respective first through holes 111 or the respective second through holes 112 to prevent the engaging arms 23 from being excessively pushed downward. Because the hooks 231 abut against the bottom surface 114 of the board body 11 and the stopping bumps 232 abut against the top surface 113 of the board body 11, the resilient engaging arms 23 can be stably and fixedly secured to the board body 11 and upward or downward movement of the engaging arms 23 relative to the board body 11 can be prevented.

Additionally, each of the resilient engaging arms 23 includes a bent arm section 233 extending outwardly and arcuately from a respective one of the left and right sides of the pressing plate 21, and a non-bent arm section 234 extending downwardly from the bent arm section 233. The hook 231 is formed at a bottom end of the non-bent arm section 234. The stopping bump 232 is formed at a front end of the non-bent arm section 234. The user can press the non-bent arm sections 234 of the resilient engaging arms 23 toward each other so as to move the hooks 231 of the engaging arms 23 away from the bottom surface 114 of the board body 11, after which the securing member 2 can be pulled upward with the engaging arms 23 moving smoothly out of the respective first through holes 111 or the respective second through holes 112. Hence, the user can quickly and easily detach the securing member 2 from the board body 11.

Figure 6:
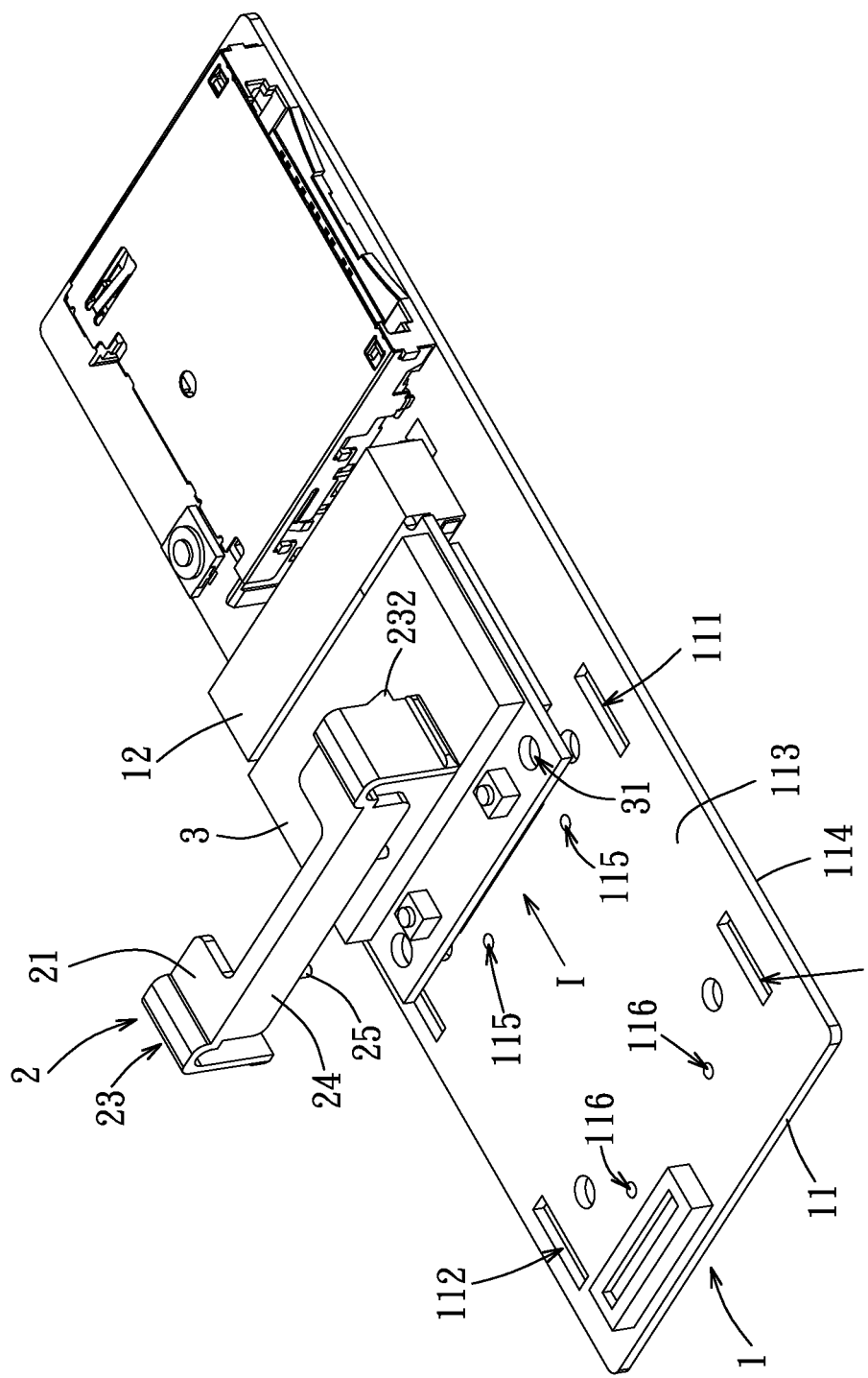
FIG. 6 is a view similar to FIG. 1, but illustrating the securing member being detached from the circuit board.
Figure 7:
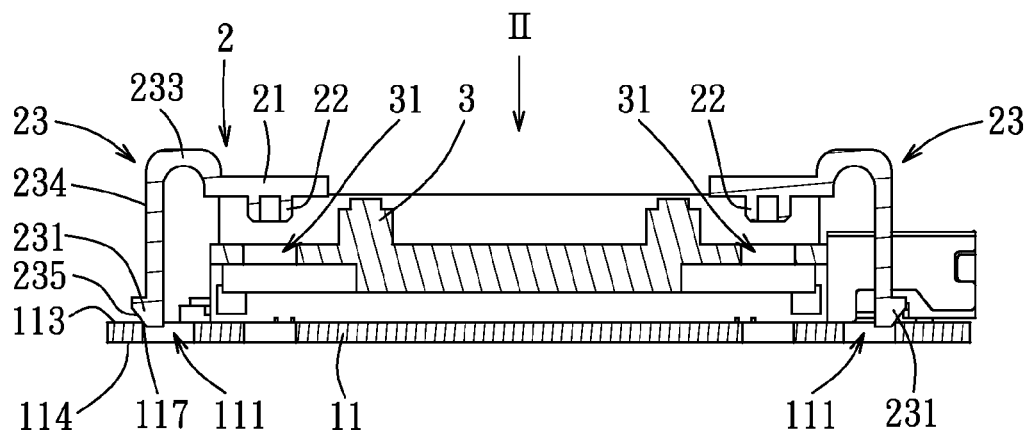
FIG. 7 is a sectional view of the combined circuit board and electronic card assembly of FIG. 1, illustrating a pressing plate of the securing member in a non-pressed state.
Figure 8:
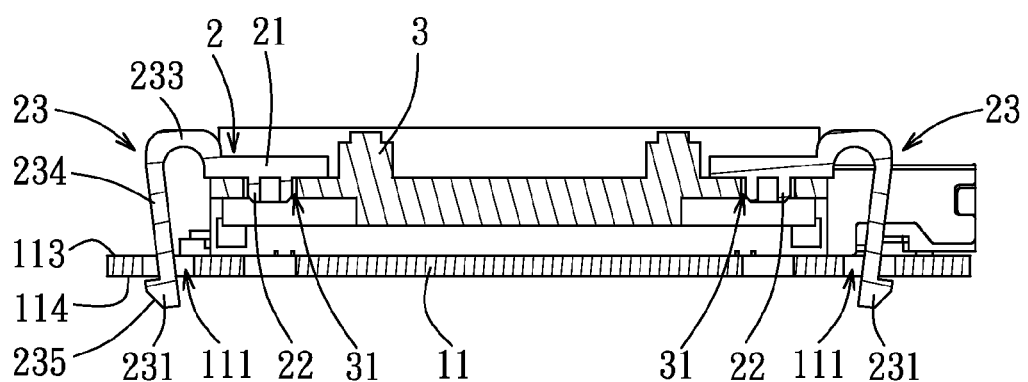
FIG. 8 is a view similar to FIG. 7, but illustrating hooks of resilient engaging arms extending respectively through first through holes in the circuit board when a pressing plate of the securing member is pressed against the first electronic card.

As shown in FIGS. 3, 5 and 6, the board body 11 is further formed with at least one first positioning hole 115 and at least one second positioning hole 116 each extending through the top and bottom surfaces 113, 114 thereof. The first positioning hole 115 is disposed between the socket connector 12 and the second positioning hole 116. The securing member 2 further includes a blocking plate 24 extending from a bottom side of the pressing plate 21, and at least one positioning boss 25 projecting from a bottom end of the blocking plate 24. When a selected one of the first and second electronic cards 3, 4 is inserted into the socket connector 12 and the pressing plate 21 is pressed against the selected one of the first and second electronic cards 3, 4, the blocking plate 24 abuts against the rear end of the first or second electronic card 3, 4 that is opposite to the socket connector 12, and the positioning boss 25 engages the first or second positioning hole 115, 116. Through the engagement of the positioning boss 25 with the first or second positioning hole 115, 116, the securing member 2 can be positioned stably on the board body 11 and prevented from moving to-and-fro along the extending direction of the first or second through hole 111, 112.

In this embodiment, the board body 11 is formed with two first positioning holes 115 spaced apart from each other in the left-right direction and two second positioning holes 116 also spaced apart from each other in the left-right direction. The securing member 2 includes two positioning bosses 25 projecting from the bottom end of the blocking plate 24 and spaced apart from each other in the left-right direction. The positioning bosses 25 are selectively engageable with the respective first positioning holes 115 and the respective second positioning holes 116. Through this configuration, the securing member 2 can fix more stably the first electronic card 3 or the second electronic card 4 on the board body 11.

As shown in FIGS. 6, 7, 8 and 9, to fix the first electronic card 3 on the board body 11 of the circuit board 1, the first electronic card 3 is first inserted into the socket connector 12 in the direction of an arrow (I). Next, the resilient engaging arms 23 of the securing member 2 are brought into alignment with the respective first through holes 111, and the pressing plate 21 of the securing member 2 is pressed against the first electronic card 3 in the direction of an arrow (II). Because a downward slope surface 235 of the hook 231 of each engaging arm 23 abuts against a top edge 117 of the respective first through hole 111, when the pressing plate 21 is pressed further, the hook 231 is guided to move inwardly into the respective first through hole 111, bringing along the non-bent arm section 234 to deform and bend inwardly and resiliently relative to the bent arm section 233. The hook 231 of each engaging arm 23 can thus move smoothly through the respective first through hole 111.

Figure 10:
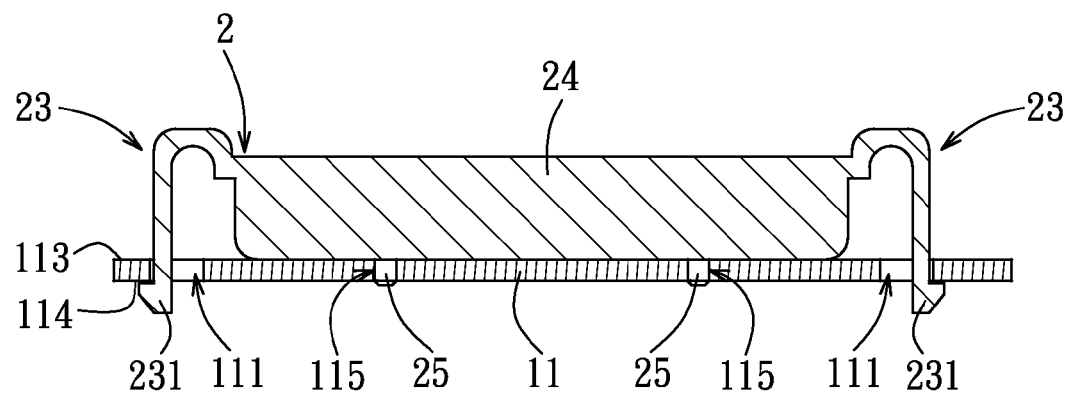
FIG. 10 is another sectional view of the embodiment of the present invention, illustrating a blocking plate abutting against the circuit board.

As the stopping bump 232 of each engaging arm 23 abuts against the top surface 113 of the board body 11, as shown in FIG. 1, the pressing plate 21 of the securing member 2 cannot be pressed further. At this time, the hooks 231 of the engaging arms 23 abut against the bottom surface 114 of the board body 11 by virtue of the resilient restoring force of the engaging arms 23. Simultaneously, as shown in FIG. 10, the blocking plate 24 of the securing member 2 abuts against the top surface 113 of the board body 11, and the positioning bosses 25 engage the respective first positioning holes 115, thereby positioning fixedly the securing member 2 on the board body 11.

Figure 9:
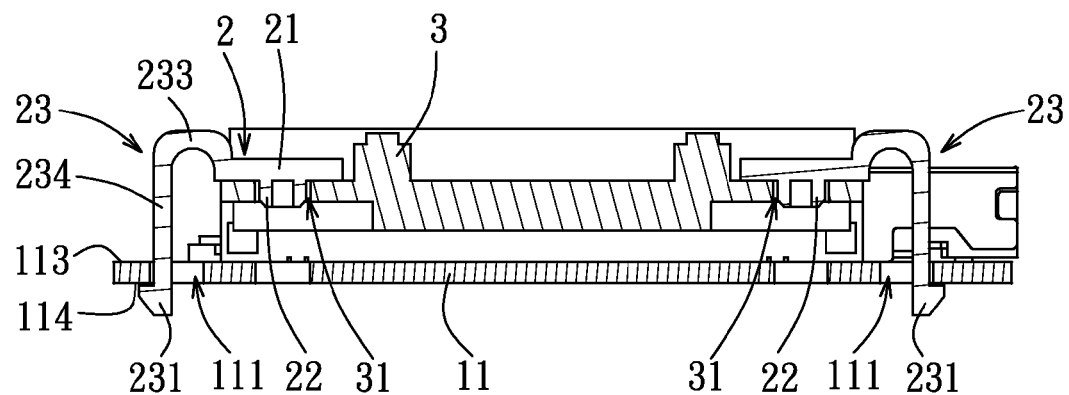
FIG. 9 is an assembled sectional view of the combined circuit board and electronic card assembly of FIG. 1.

As shown in FIGS. 1 and 9, when the securing member 2 is positioned on the board body 11, the pressing plate 21 abuts against a top surface of the first electronic card 3 at the rear end thereof so as to prevent tilting of the rear end of the first electronic card 3. Further, the engaging studs 22 of the securing member 2 are engaged to the respective first apertures 31 of the first electronic card 3 so as to prevent movement of the first electronic card 3 in the front-rear and left-right directions. Moreover, the blocking plate 24 of the securing member 2 abuts against the rear end of the first electronic card 3 so as to prevent removal of the first electronic card 3 from the socket connector 12. Hence, the securing member 2 can stably fix the first electronic card 3 to the board body 11 of the circuit board 1, so that the first electronic card 3 can remain connected to the socket connector 12 for transmitting a signal.

Figure 11:
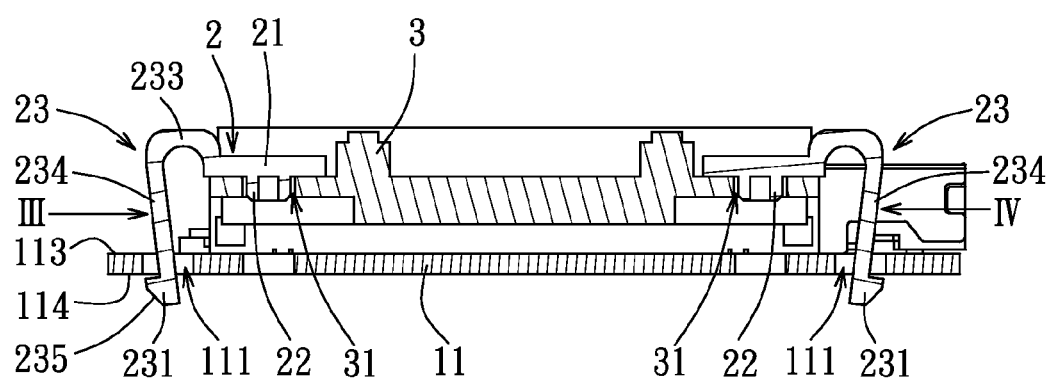
FIG. 11 is a view similar to FIG. 9, but illustrating the resilient engaging arms being pressed inwardly to move away from the bottom surface of the circuit board.

As shown in FIG. 11, to detach the first electronic card 3 from the socket connector 12, the non-bent arm sections 234 of the resilient engaging arms 23 are pressed toward each other in the direction of arrows (III and IV), respectively, so as to deform and bend inwardly the non-bent arm sections 234 relative to the bent arm sections 233. At this time, the hooks 231 of the engaging arms 23 are moved away from the bottom surface 114 of the board body 11 and are disposed in alignment with the respective first through holes 111. Next, the securing member 2 is pulled upward in a direction opposite to the arrow (II) (see FIG. 7) to pull the hooks 231 out of the respective first through holes 111. Simultaneously, the pressing plate 21 is separated from the top surface of the first electronic card 3, the engaging studs 22 are disengaged from the respective first apertures 31, and the positioning bosses 25 (see FIG. 6) are disengaged from the respective first positioning holes 115 (see FIG. 6). As shown in FIG. 6, when the securing member 2 is moved away from the first electronic card 3, the user can detach the first electronic card 3 from the socket connector 12 in the opposite direction of the arrow (I).

Figure 12:
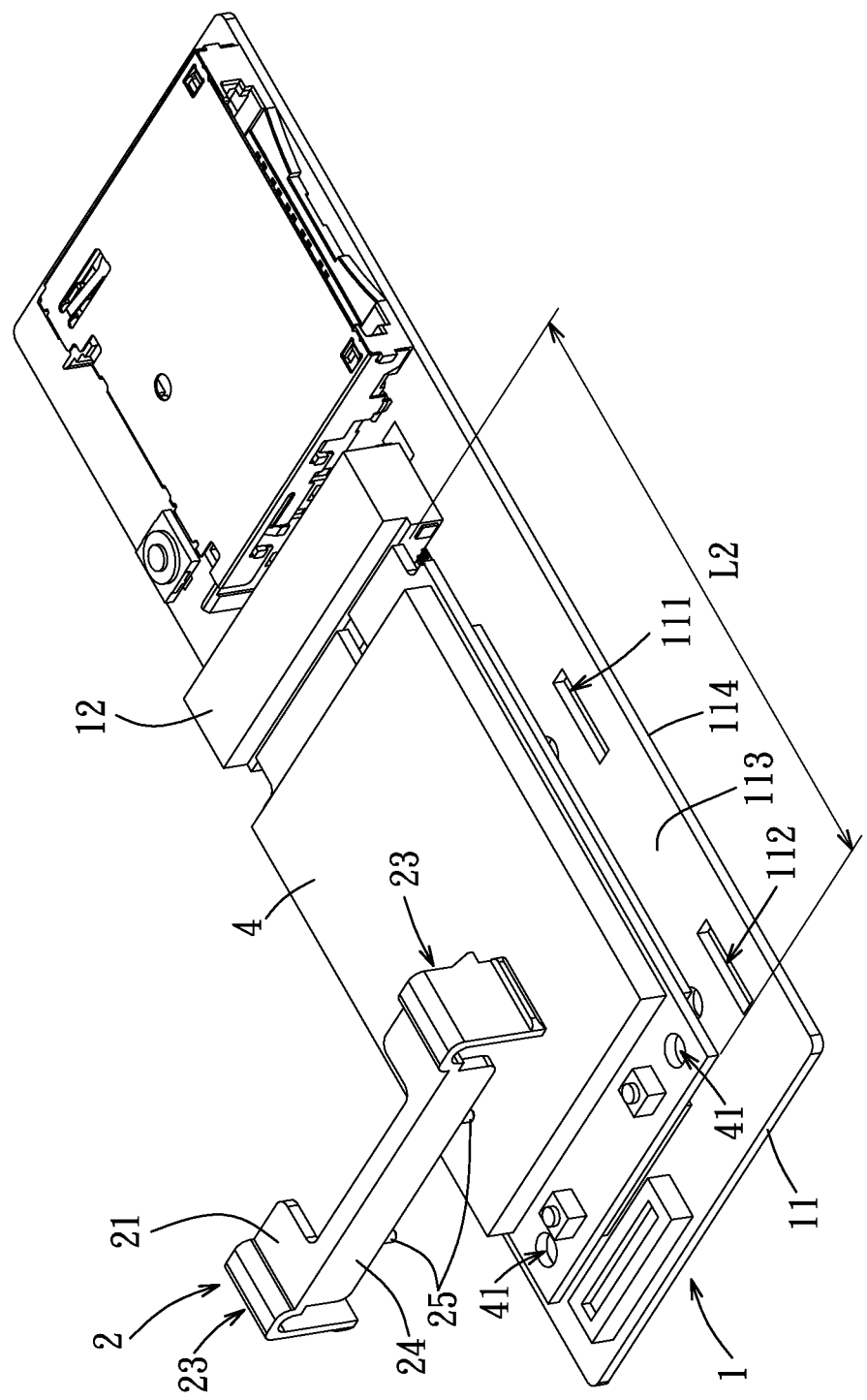
FIG. 12 is an exploded perspective view of the combined circuit board and electronic card assembly of FIG. 2.
Figure 13:
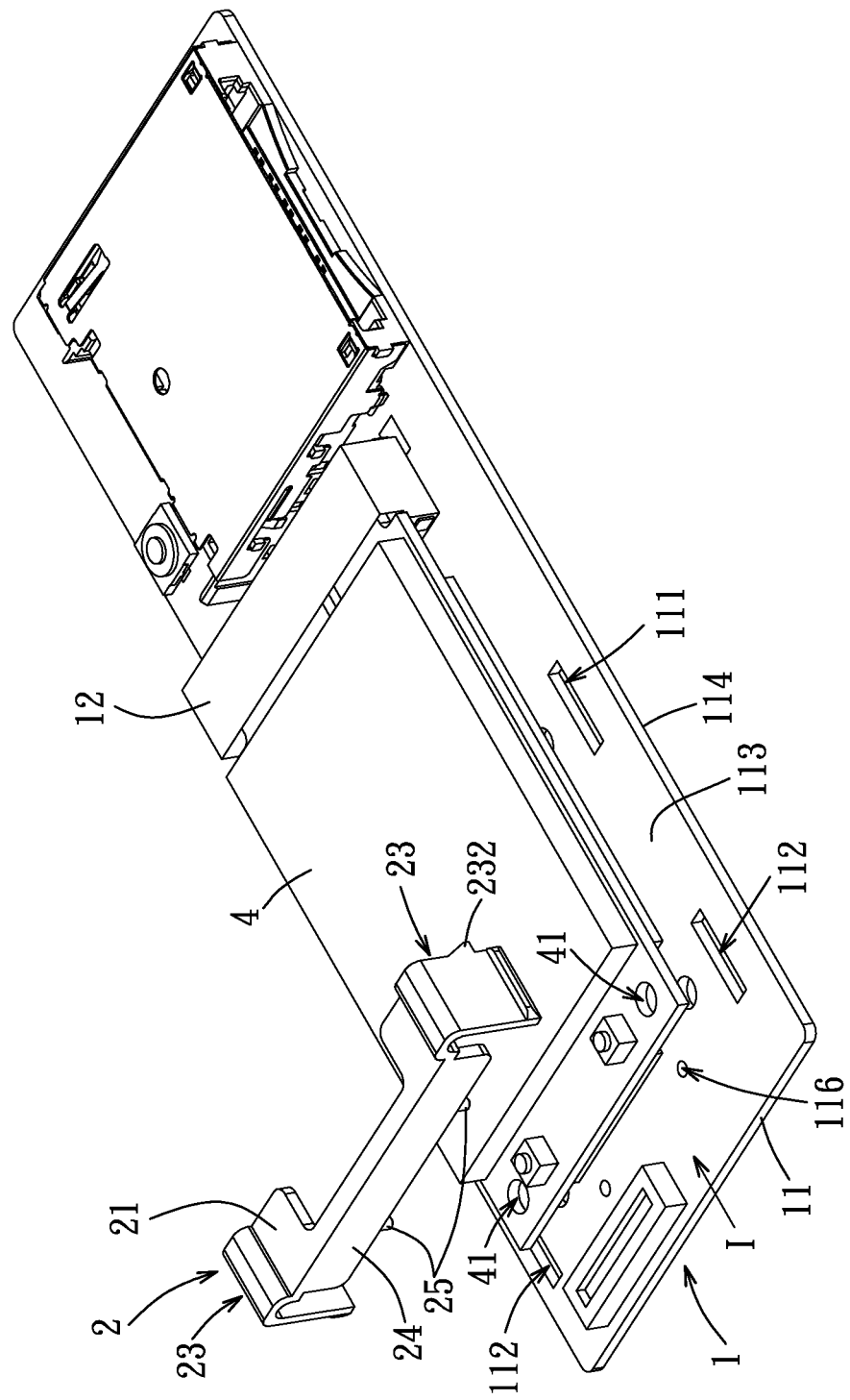
FIG. 13 is a view similar to FIG. 2, but illustrating the securing member being detached from the circuit board.
Figure 14:
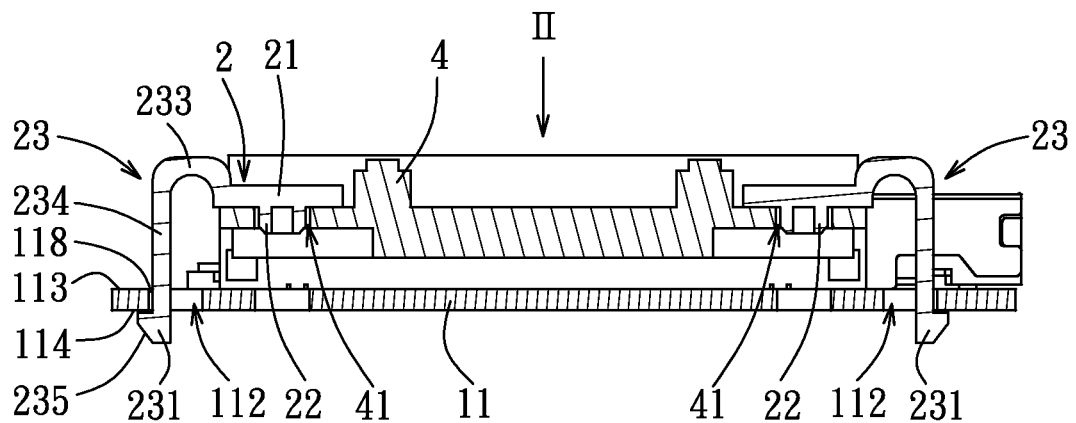
FIG. 14 is an assembled sectional view of the combined circuit board and electronic card assembly of FIG. 2.

Fixing of the second electronic card 4 on the circuit board 1 is similar to that described for the first electronic card 3. That is, as shown in FIGS. 12, 13 and 14, the second electronic card 4 is first inserted into the socket connector 12 in the direction of the arrow (I), after which the resilient engaging arms 23 are brought into alignment with the respective second through holes 112, and the pressing plate 21 of the securing member 2 is pressed against the second electronic card 4 in the direction of the arrow (II). Because the slope surface 235 of the hook 231 of each resilient engaging arm 23 abuts against a top edge 118 of the respective second through hole 112, as the pressing plate 21 is pressed further, the hook 231 is guided to move inwardly into the respective second through hole 112, bringing along the non-bent arm section 234 of the engaging arm 23 to deform and bend inwardly and resiliently relative to the bent arm section 233 of the engaging arm 23. The hook 231 of each engaging arm 23 can thus move smoothly through the respective second through hole 112.

As the stopping bumps 232 of the engaging arms 23 abut against the top surface 113 of the board body 11, the pressing plate 231 of the securing member 2 cannot be pressed further. At this time, the hooks 231 of the engaging arms 23 abut against the bottom surface 114 of the board body 11 by virtue of the resilient restoring force of the engaging arms 23. Simultaneously, the pressing plate 21 abuts against a top surface of the second electronic card 4 at the rear end thereof, and the engaging studs 22 of the securing member 2 are engaged to the respective second apertures 41 of the second electronic card 4. Further, the blocking plate 24 of the securing member 2 abuts against the rear end of the second electronic card 4, and the positioning bosses 25 are engaged to the respective second positioning holes 116. Hence, the securing member 2 can stably fix the second electronic card 4 to the board body 11 of the circuit board 1, so that the second electronic card 4 can remain connected to the socket connector 12 for transmitting a signal.

Figure 15:
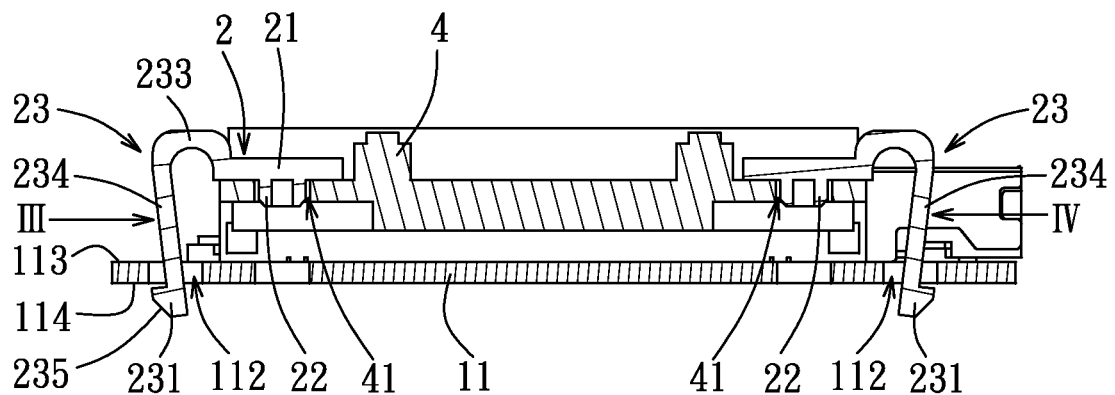
FIG. 15 is a view similar to FIG. 14, but illustrating the resilient engaging arms being pressed inwardly to move away from the bottom surface of the circuit board.

As shown in FIG. 15, the non-bent arm sections 234 of the resilient engaging arms 23 are pressed toward each other in the direction of the arrows (III, IV), respectively, so as to deform and bend inwardly the non-bent arm sections 234 relative to the bent arm sections 233. Through this, the hooks 231 of the engaging arms 23 can move away from the bottom surface 114 of the board body 11 and align with the respective second through holes 112. Next, the securing member 2 is pulled upward in a direction opposite to the arrow (II) (see FIG. 7) to pull the hooks 231 out of the respective second through holes 112. Simultaneously, the pressing plate 21 is separated from the top surface of the second electronic card 4, the engaging studs 22 are disengaged from the respective second apertures 41, and the positioning bosses 25 are disengaged from the respective second positioning holes 116. When the securing member 2 is moved away from the second electronic card 4, the user can detach the second electronic card 4 from the socket connector 12 in the opposite direction of the arrow I (see FIG. 13).

In summary, through the detachable configuration of the securing member 2, the circuit board 1 of the combined circuit board and electronic card assembly of the present invention can accommodate the first electronic card 3 and the second electronic card 4 of different lengths. Therefore, the top surface 113 of the board body 11 of the circuit board 1 can be fully utilized, and the first electronic card 3 and the second electronic card 4 can be alternatively inserted into the socket connector 12. Furthermore, because the securing member 2 can easily and quickly fix or permit removal of the first and second electronic cards 3, 4 of different lengths on or from the circuit board 1, the time of assembling and disassembling of the combined circuit board and electronic card assembly of the present invention can be effectively reduced. Hence, the objects of the present invention can be realized.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A circuit board device for fixing an electronic card, the electronic card being formed with at least one aperture, said circuit board device comprising:
    a circuit board including a board body, and a socket connector provided on said board body for mating with the electronic card, said board body being formed with two first through holes spaced apart from each other in a left-right direction; and
    a securing member including a pressing plate for pressing against the electronic card, at least one engaging stud projecting from a bottom end of said pressing plate for engaging the aperture, and two resilient engaging arms provided respectively on left and right sides of said pressing plate, said resilient engaging arms extending respectively through said first through holes and engage releasably said board body;
        wherein said board body includes a bottom surface, and each of said resilient engaging arms includes a hook abutting against said bottom surface, a bent arm section extending outwardly and accurately from a respective one of said left and right sides of said pressing plate, and a non-bent arm section extending downwardly from said bent arm section, said hook being formed at a bottom end of said non-bent arm section.

2. The circuit board device of claim 1, wherein said board body further includes a top surface, each of said first through holes penetrating said top and bottom surfaces, each of said resilient engaging arms further including a stopping bump disposed above said hook and abutting against said top surface.

3. The circuit board device of claim 2, wherein each of said first through holes has a top edge, said hook of each of said resilient engaging arms having a downward slope surface abutting against said top edge before each of said resilient engaging arms extends through the respective one of said first through holes.

4. The circuit board device of claim 2, wherein said top surface of said board body is formed with at least one first positioning hole, said securing member including a blocking plate extending from a bottom side of said pressing plate, and at least one positioning boss projecting from a bottom end of said blocking plate, said blocking plate being adapted to abut against one end of the electronic card that is opposite to said socket connector, said positioning boss being engaged to said first positioning hole.

5. The circuit board device of claim 4, wherein said top surface of said board body is formed with two said first positioning holes spaced apart from each other in a left-right direction, said securing member including two said positioning bosses projecting from said bottom end of said blocking plate and respectively engaged to said first positioning holes.

6. The circuit board device of claim 1, the electronic card is formed with two apertures spaced apart from each other in a left-right direction, wherein said securing member includes two said engaging studs projecting from said bottom end of said pressing plate for engaging respectively said two apertures.

7. A combined circuit board and electronic card assembly, comprising:
   a circuit board including a board body, and a socket connector provided on said board body, said board body being formed with two first through holes spaced apart from each other in a left-right direction, and two second through holes spaced apart from each other in a left-right direction, said first through holes being disposed between said socket connector and said second through holes;
   a securing member including a pressing plate, at least one engaging stud projecting from a bottom end of said pressing plate, and two resilient engaging arms provided respectively on left and right sides of said pressing plate; and
   a first electronic card having a first length and being formed with at least one first aperture;
   wherein, when said first electronic card is inserted into said socket connector and said pressing plate is pressed against said first electronic card, said engaging stud engages said first aperture, and said resilient engaging arms extend respectively through said first through holes and engage releasably said board body;
   wherein said board body includes a bottom surface, and each of said resilient engaging arms includes a hook abutting against said bottom surface, a bent arm section extending outwardly and accurately from a respective one of said left and right sides of said pressing plate, and a non-bent arm section extending downwardly from said bent arm section, said hook being formed at a bottom end of said non-bent arm section.

8. The combined circuit board and electronic card assembly of claim 7, further comprising a second electronic card having a second length greater than said first length, said second electronic card being formed with at least one second aperture, said first electronic card and said second electronic card being selectively inserted into said socket connector, wherein, when said second electronic card is inserted into said socket connector and said pressing plate is pressed against said second electronic card, said engaging stud engages said second aperture, and said resilient engaging arms extend respectively through said second through holes and engage releasably said board body.

9. The combined circuit board and electronic card assembly of claim 8, wherein said first electronic card is formed with two said first apertures spaced apart from each other in a left-right direction, said second electronic card is formed with two said second apertures spaced apart from each other in a left-right direction, said securing member including two said engaging studs projecting downward from said bottom end of pressing plate, each of said engaging studs being selectively engagable with a respective one of said first and second apertures.

10. The combined circuit board and electronic card assembly of claim 8, wherein said board body further includes a top surface, each of said first and second through holes penetrating said top and bottom surfaces, each of said resilient engaging arms further including a stopping bump disposed above said hook and abutting against said top surface.

11. The combined circuit board and electronic card assembly of claim 10, wherein each of said first and second through holes has a top edge, said hook of each said resilient engaging arm having a downward slope surface abutting against said top edge of said first through hole or said second through hole before said resilient engaging arms respectively extend through said first through holes or said second through holes.

12. The combined circuit board and electronic card assembly of claim 10, wherein said top surface of said board body is formed with at least one first positioning hole, said securing member including a blocking plate extending from a bottom side of pressing plate, and at least one positioning boss projecting from a bottom end of said blocking plate, and wherein, when said first electronic card is inserted into said socket connector, said blocking plate abuts against one end of said first electronic card that is opposite to said socket connector, and said positioning boss engages said first positioning hole.

13. The combined circuit board and electronic card assembly of claim 12, wherein said top surface of said board body is formed with at least one second positioning hole, said first positioning hole being disposed between said socket connector and said second positioning hole, and wherein, when said second electronic card is inserted into said socket connector, said blocking plate abuts against one end of said second electronic card that is opposite to said socket connector, and said positioning boss engages said second positioning hole.

14. The combined circuit board and electronic card assembly of claim 13, wherein said top surface of said board body is formed with two said first positioning holes spaced apart from each other in a left-right direction and two said second positioning holes spaced apart from each other in a left-right direction, said securing member including two said positioning bosses selectively engagable with said first positioning holes and said second positioning holes.

* * * * *